(12) United States Patent
Karrer et al.

(10) Patent No.: US 6,624,624 B1
(45) Date of Patent: Sep. 23, 2003

(54) ELECTRICAL CURRENT SENSOR

(75) Inventors: Nicolas Karrer, Zurich (CH); Patrick Hofer-Noser, Bern (CH)

(73) Assignee: Arbeitsgemeinschaft Prof. Hugel AGPH, Zurich (CH)

( * ) Notice: Subject to any disclaimer, the term of this patent is extended or adjusted under 35 U.S.C. 154(b) by 0 days.

(21) Appl. No.: 09/979,416

(22) PCT Filed: May 25, 2000

(86) PCT No.: PCT/IB00/00717

§ 371 (c)(1),
(2), (4) Date: Nov. 6, 2001

(87) PCT Pub. No.: WO00/72027

PCT Pub. Date: Nov. 30, 2000

(30) Foreign Application Priority Data

May 25, 1999 (CH) ................................ 0973/99

(51) Int. Cl.$^7$ .......................... G01R 33/00; H01F 40/06
(52) U.S. Cl. .................................. 324/117 R; 324/127
(58) Field of Search ........................ 324/117 R, 127, 324/207.2, 522; 336/200; 359/280

(56) References Cited

U.S. PATENT DOCUMENTS

| | | | |
|---|---|---|---|
| 4,939,449 A | * 7/1990 | Cattaneo et al. | ........ 324/117 R |
| 5,442,280 A | * 8/1995 | Baudart | ........ 324/127 |
| 6,441,605 B1 | * 8/2002 | Baurand et al. | ........ 324/127 |

FOREIGN PATENT DOCUMENTS

| | | |
|---|---|---|
| DE | 3929452 A | 3/1991 |
| JP | 58005668 A | 1/1983 |

* cited by examiner

*Primary Examiner*—N. Le
*Assistant Examiner*—Walter Benson
(74) *Attorney, Agent, or Firm*—Clifford W. Browning; Woodard, Emhardt, Moriarty, McNett & Henry LLP

(57) ABSTRACT

A current sensor for measuring a time-varying electrical current ($I_m$) in a portion of primary conductor (1), the sensor including a sensor conductor comprising first and second ends (3,4) for connection to a signal processing circuit, a first conductor portion extending from the first end and having a plurality of windings (5) to form a first coil portion, and a second conductor portion returning to the second end. Centres of the windings define a median coil place substantially parallel to the magnetic field ($H_m$) generated by the time-varying current ($I_m$) to be measured, the sensor conductor defining one or a plurality of interference field surfaces as seen projected on a plane parallel to the median plane enclosed by clockwise or anti-clockwise interference field current circulating portions (22,23) of the sensor conductor. The second conductor portion is arranged such that the surface area of the one or more projected interference field surfaces is close to zero or less than ten times the measurement surface area ($A_m$) of a winding, and/or such that the voltage induced by a magnetic interference field component ($H_s$) orthogonal to the median plane in the clockwise interference field circulating portions is substantially cancelled by the voltage induced in the anti-clockwise interference field circulating portions.

16 Claims, 9 Drawing Sheets

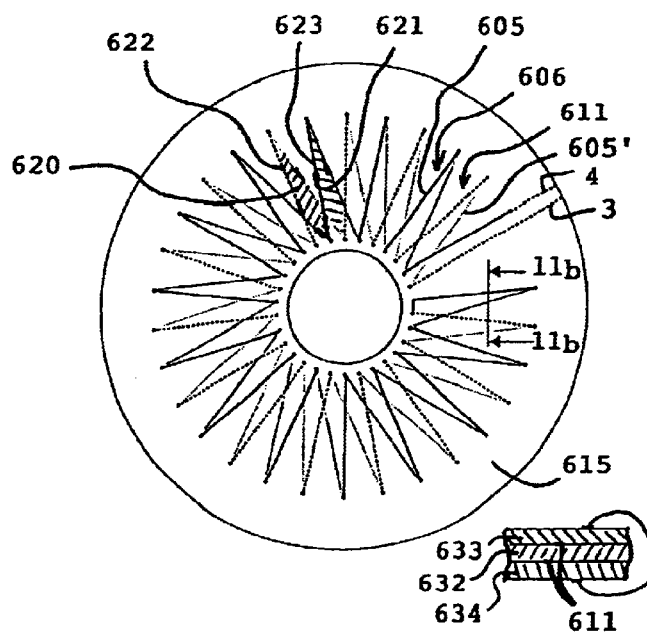
FIG 11 a
FIG 11 b
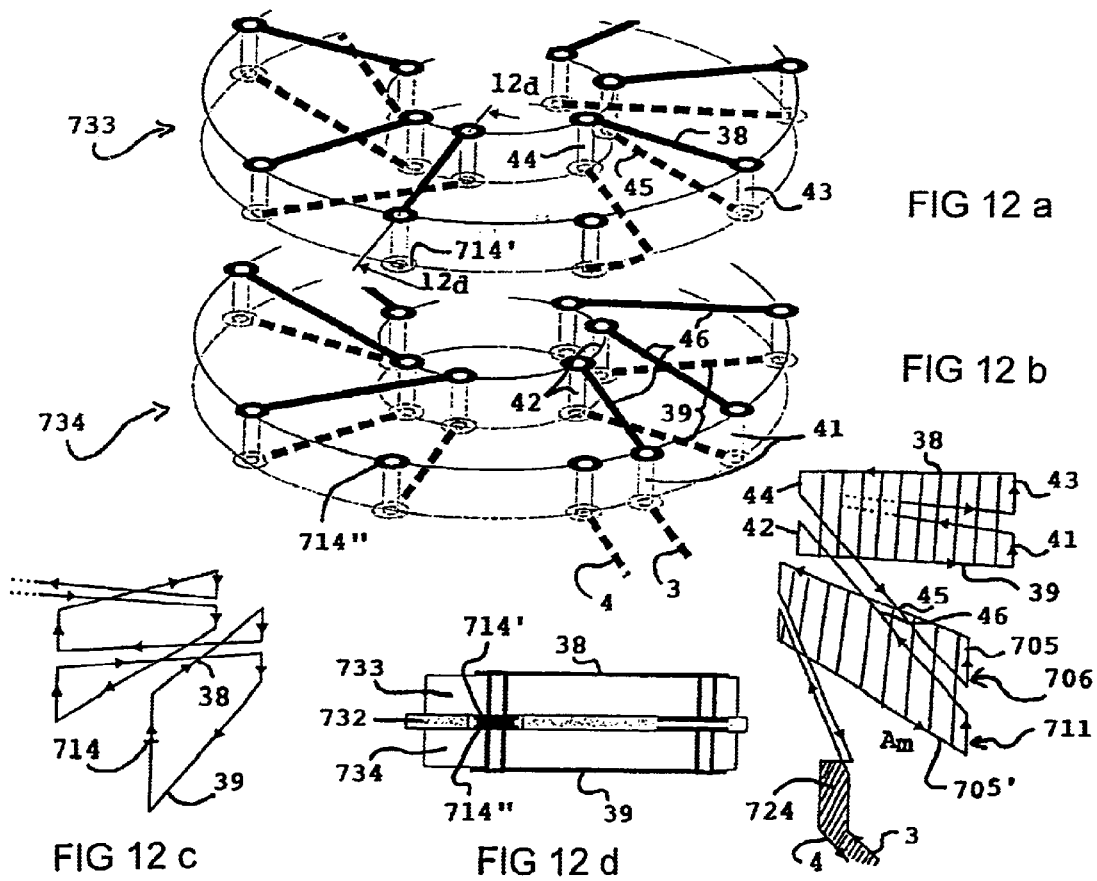
FIG 12 a
FIG 12 b
FIG 12 c
FIG 12 d

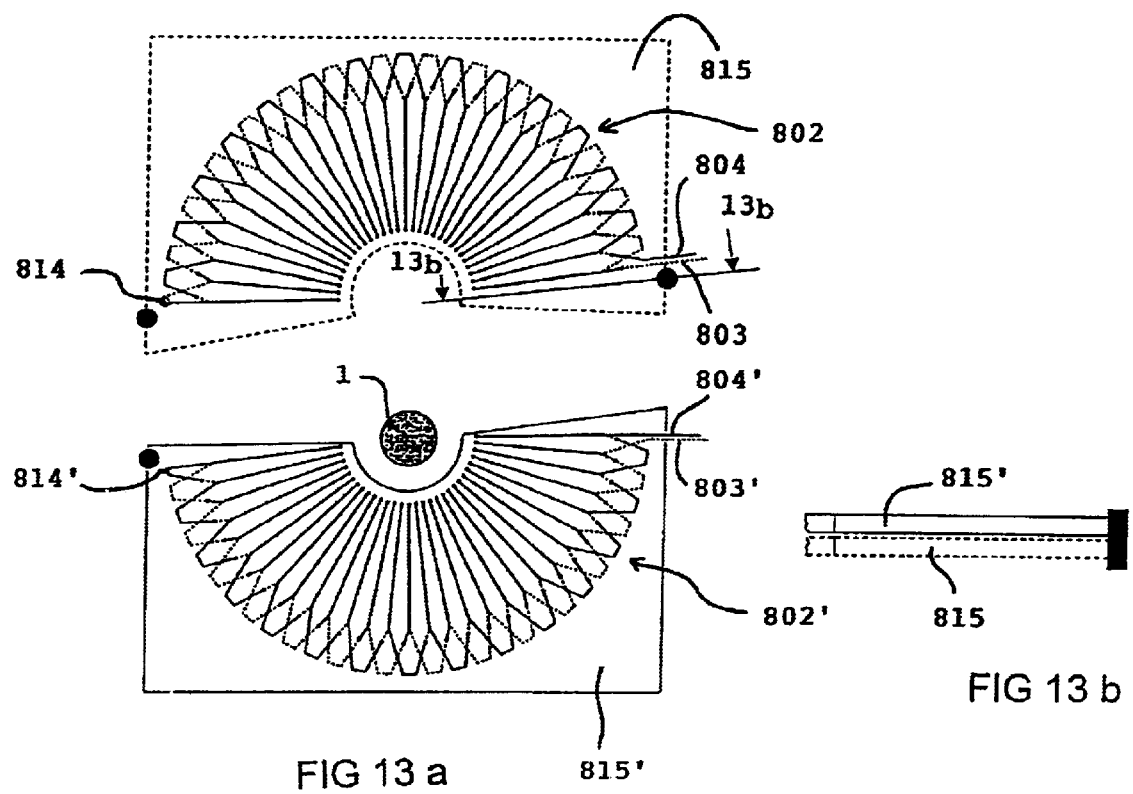
FIG 13 a
FIG 13 b
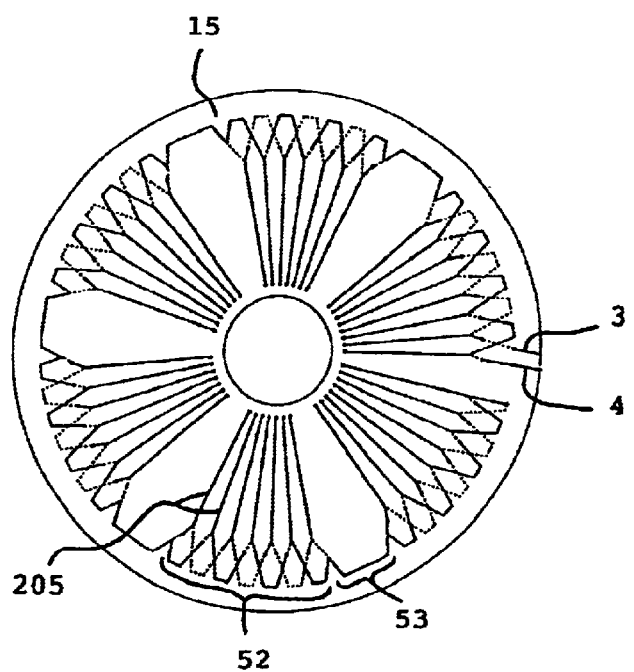
FIG 14

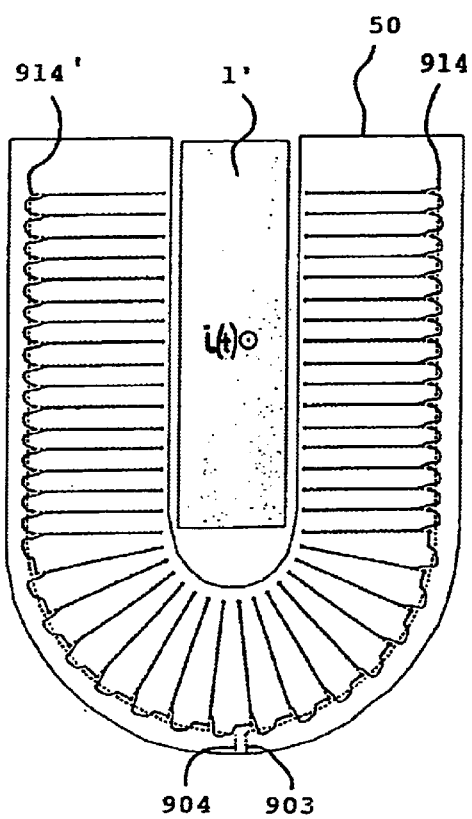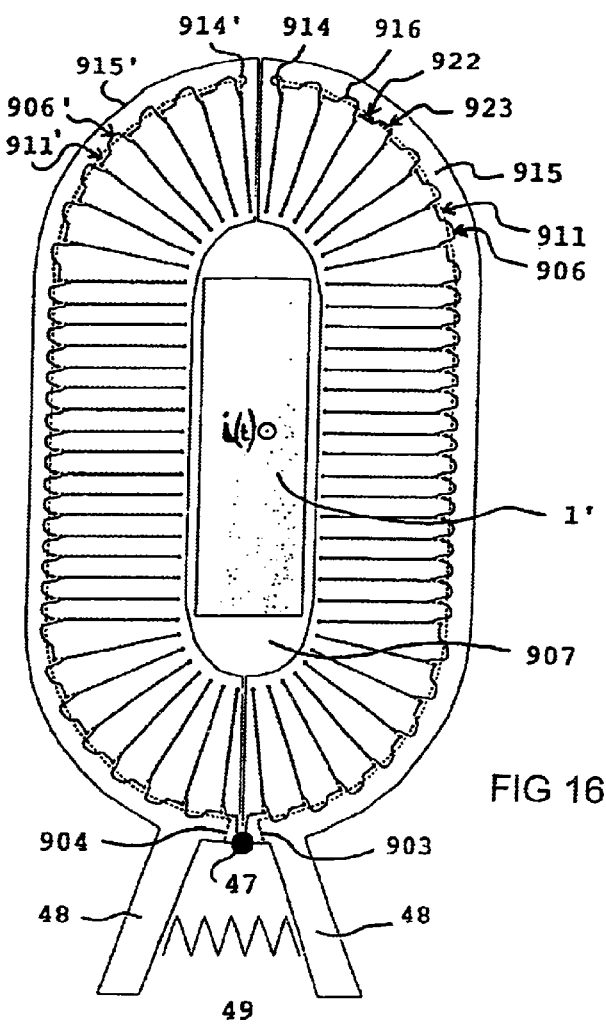
FIG 15
FIG 16
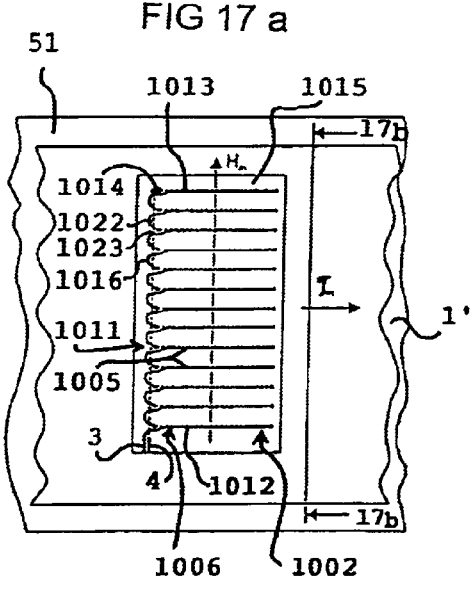
FIG 17 a
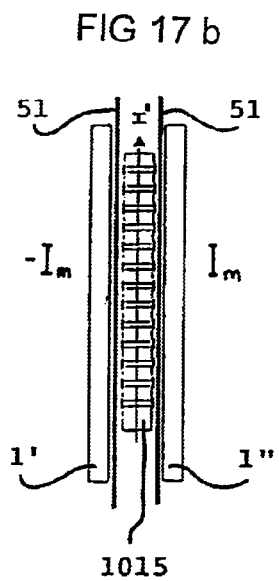
FIG 17 b

ELECTRICAL CURRENT SENSOR

This invention relates to an electrical current sensor, in particular for the measurement of a time-varying electrical current in a conductor.

A well-known means of measuring an electrical current flowing through a primary conductor is by measuring the generated magnetic field with a magnetic field sensor, positioned around or in the proximity of the primary conductor. Time-varying electrical currents are commonly measured by means of a coil, known as a Rogowski coil, bent around the primary conductor. The varying magnetic field induces a voltage between ends of the coil conductor proportional to the rate of change of the current (di/dt) in the primary conductor. The output signal of the Rogowski coil in conventional designs is thus integrated to obtain the primary current reading. There are different known ways of providing Rogowski coils, which may for example be in the form of wound air coils, or coils formed by conductive traces on a circuit board. Examples of prior art Rogowski coils are described in Murgatroyd, P. N., *Making a Rogowski coil*, Meas. Sci. Technolog. 2 (1991), pages 1218–1219; or Ray, W. F., Murray, K. D., *The use of Rogowski coils for current wave-form measurement in power electronic circuits*, EPE 1991, pages 3379–3383; or Heumann, K., Magnetischer *Spannungsmesser hoher Präzision*, Elektrotechnische Zeitschrift, A83 (1962) 11, pages 349–356; or U.S. Pat. No. 5,442,280, or U.S. Pat. No. 5,414,400.

Conventional Rogowski coil current sensors typically have coils with a large number of windings, for example the Rogowski coil described in U.S. Pat. No. 5,414,400 is provided with about 250 windings, in order to increase the sensitivity to magnetic fields and reduce the effects of an out-of-center primary conductor. Such sensors function reasonably well within a small and defined frequency band, and positioned at relatively large distance from other conductors that generate magnetic interference fields. Furthermore, such known Rogowski coil sensors are limited to the measurement of time-varying electrical currents having frequencies up to orders of magnitude of $10^3$–$10^6$ Hz. These characteristics of conventional current sensors have been, until the present invention, accepted as technical limitations of current measurement with Rogowski coils.

Certain devices, in particular electrical power converters and inverters, may produce in the time domain large discontinuities in the current slope resulting from the switching procedures which cause frequencies in the frequency domain up to approximately $10^8$ Hz. Conventional current sensors of the Rogowski coil-type are not able to accurately and reliably measure such rapid rates of change of current. Furthermore, conventional current sensors of the aforementioned type are sensitive to magnetic interference fields which are often very difficult to avoid in view of the proximity of conductors in existing electrical power switch-mode devices, where the measurement of current is often not a primary consideration during design of the device.

It is an object of the present invention to provide a versatile yet precise sensor for measuring time-varying electrical currents flowing in a conductor.

It is particularly advantageous to provide a sensor for measurement over a large frequency range, in particular a frequency range extending into the range $10^6$–$10^8$ Hertz.

It is also particularly advantageous to provide a current sensor with reduced sensitivity to magnetic interference fields.

It is also advantageous to provide a current sensor that is compact, cost effective and that can be implemented without interrupting the primary conductor.

It is also advantageous to provide a cost effective current sensor with a high sensitivity to the field to be measured and a high signal to noise ratio.

Objects of this invention have been achieved by providing the sensor described below.

Disclosed herein is a current sensor for measuring time-varying electrical currents in a portion of a primary conductor, the sensor including a sensor conductor comprising first and second ends for connection to a signal processing circuit, a first conductor portion extending from the first end and having a plurality of windings to form a first coil portion extending from a first coil portion extremity to a second coil portion extremity, and a second conductor portion returning from the second coil portion extremity to the first coil portion extremity and to the second end, centres of the windings defining a median coil plane substantially parallel to the magnetic field generated by the current to be measured, the sensor conductor defining one or a plurality of interference field surfaces projected on the median plane enclosed by clockwise or anti-clockwise interference field current circulating portions of the sensor conductor, wherein the second conductor portion is arranged such that the surface area of the one or more projected interference field surfaces is close to zero or significantly smaller than the cross-sectional area of the windings times the number of windings, and/or such that the voltage induced by a magnetic field component orthogonal to the median plane in the clockwise interference field circulating portions is substantially cancelled by the voltage induced in the anti-clockwise interference field circulating portions.

Advantageously therefore, the effect of magnetic interference fields, in particular from external conductors in the proximity of the sensor, is cancelled or reduced to a minimum by reducing the area enclosed by the sensor conductor subject to the effects of magnetic interference fields, in particular the magnetic field component orthogonal to the median plane.

Further advantageous features of the invention are set forth in the claims or will become apparent from the following description and drawings.

Embodiments of the invention will now be described by way of example with reference to the figures, in which.

FIG. 11*a* is a view of a seventh embodiment of a sensor according to the invention;

FIG. 11*b* is a cross-sectional view through line **10*b*—10*b* of FIG. 10*a*;**

FIG. 12a is a perspective exploded view of part of a sensor according to an eighth embodiment of the invention;

FIGS. 12b and 12c are schematic perspective diagrams showing the wiring of the embodiment of FIG. 12a;

FIG. 12d is a cross-sectional view through line 12d—12d of the embodiment of FIG. 12a;

FIG. 13a is a view of a ninth embodiment of a sensor according to the invention;

FIG. 13b is a cross-sectional view through line 13b—13b of the assembled sensor according to FIG. 13a;

FIG. 14 is a view of a tenth embodiment of a sensor according to the invention;

FIG. 15 is a view of an eleventh embodiment of a sensor according to the invention;

FIG. 16 is a view of a twelfth embodiment of a sensor according to the invention;

FIG. 17a is a view of a thirteenth embodiment of a sensor according to the invention;

FIG. 17b is a view in a direction of arrow 17b of FIG. 17a; and

Figure 18:
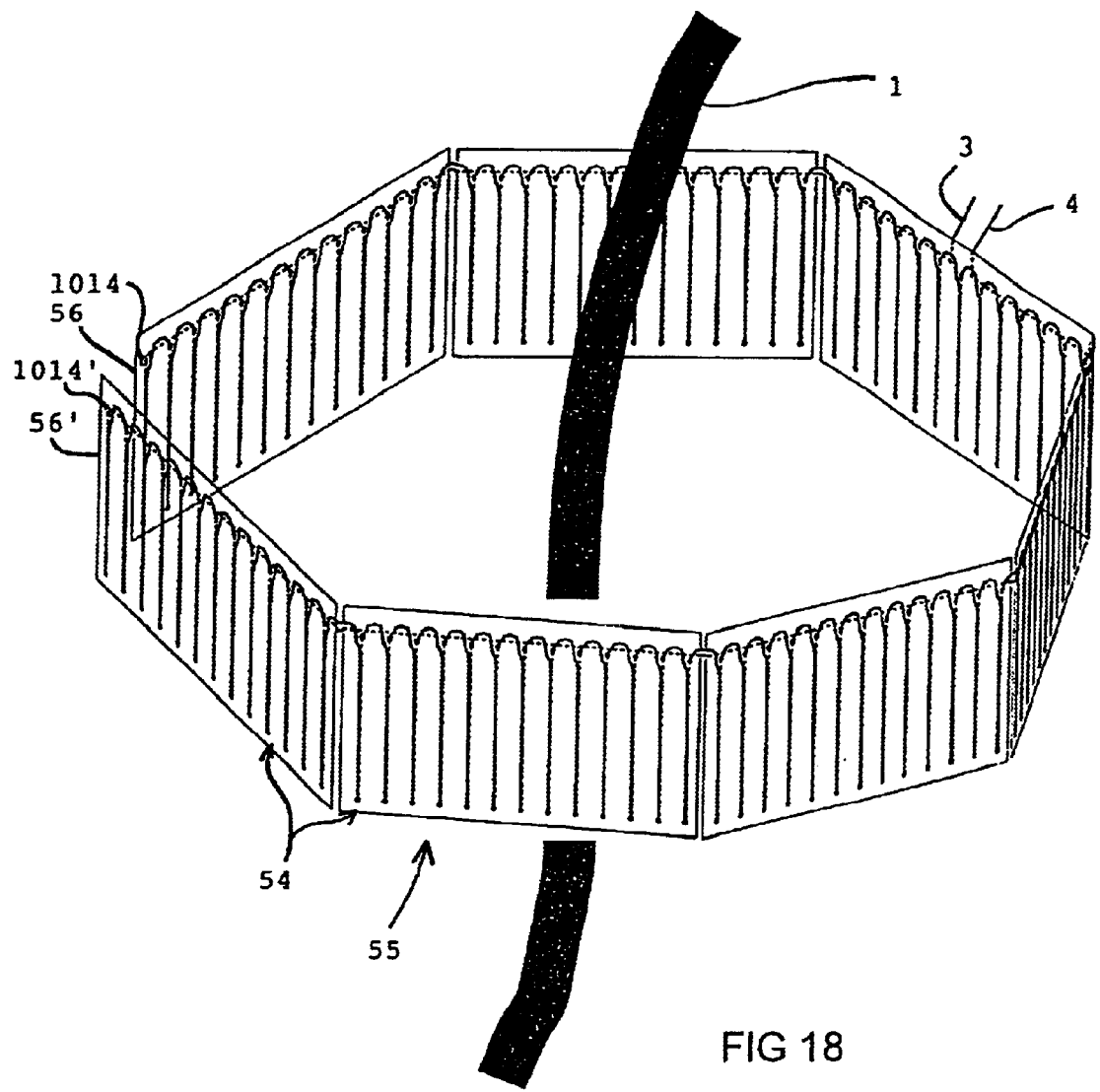

FIG. 18 is a perspective view of a sensor incorporating sensor elements according to the embodiment of FIGS. 17a and 17b.

Figure 1:
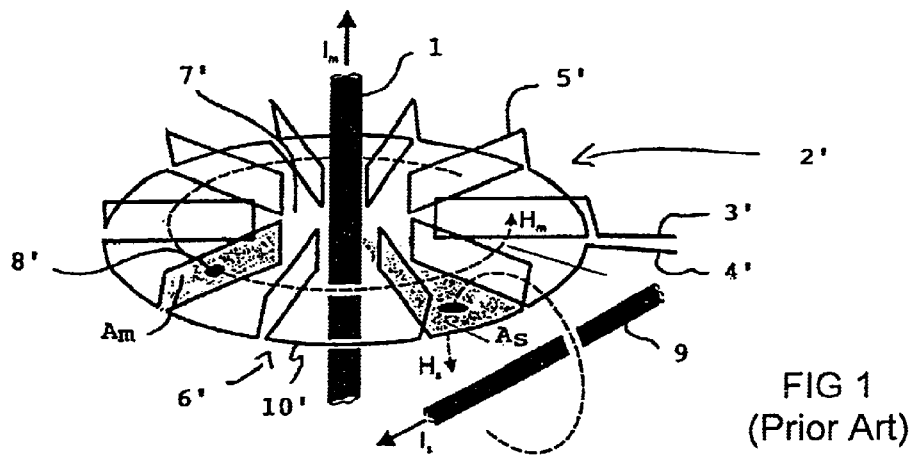
FIG. 1 is a perspective view of a conventional coil sensor.

Referring first to FIG. 1, a conventional sensor for measuring the current $I_m$ in a primary conductor 1 comprises a conductor 2' having ends 3', 4' for connection to a signal processing device, and N windings 5' forming a coil portion 6' surrounding a cavity portion 7' through which a portion of the primary conductor extends. Each winding 5' defines a projected measurement surface area $A_m$ in a plane orthogonal to the magnetic field $H_m$ generated by the primary conductor $I_m$.

In a plane orthogonal to the primary conductor portion 1, i.e. parallel to a median plane through the centers 8' of the windings 5', the conductor 2' encircles a projected surface area $A_s$ subject to magnetic interference fields which, in the case of FIG. 1, is almost equal to the surface area of the circle bounded by the outer circular periphery 10' of the conductor 2'. A magnetic interference field $H_s$, in particular the component orthogonal to the surface $A_s$, induces a voltage in the sensor conductor, thus distorting the measurement of the primary conductor current. The magnetic interference field $H_s$ may for example be produced by an external conductor 9 carrying a current $I_s$, arranged in the proximity of the sensor.

In certain conventional Rogowski coil sensor devices, the conductor is returned with windings to form a second coil which also increases the number N of windings of the sensor and thus the sensitivity to magnetic fields to be measured. The projected area $A_s$ enclosed by the conductor of a known sensor of this type is shown with the cross-hatching in FIG. 2. The area $A_s$ is completely enclosed by the conductor 2" and thus subject to the effect of magnetic interference fields $H_s$. The first coil portion 6" is connected at point 14" to the second coil portion 11".

The adverse influence of the surface area $A_s$ subject to the effects of magnetic interference fields $H_s$ is partially reduced in conventional devices by having a large number of windings such that the sum of winding measurement surface areas ($N \times A_m$) is relatively large or at least larger than the surface area $A_s$. The large number of windings however has adverse effects on the performance of the coil by reducing the bandwidth, in particular by reducing the upper frequency limit which is determined by the first resonance frequency of the sensor circuit. This is believed to be mainly because of the increased length of the conductor, which increases the self-inductance and introduces capacitive coupling between portions thereof.

The impedance transfer function of an air coil may be approximated with the following equation:

$$Z(s) = \frac{sL + R}{s^2 LC + sCR + 1}$$

which is only valid up to and including the first resonance frequency and where s is the Laplace operator, and L, R the series self-inductance and resistance and C the parallel capacitance of the coil respectively. One can thus deduce from this equation that the resonance frequency reduces with an increase in the term $s^2$ LC, therefore with an increase in self-inductance and capacitance of the coil.

In certain applications, such as in power converters and inverters, very large currents may be subject to rapid changes, in the order of a few thousand amperes per microsecond (kA/$\mu$s) which corresponds to frequency components up to approximately $10^8$ Hertz, which conventional sensors of the Rogowski coil type are unable to measure because of the limited bandwidth.

Figure 2:
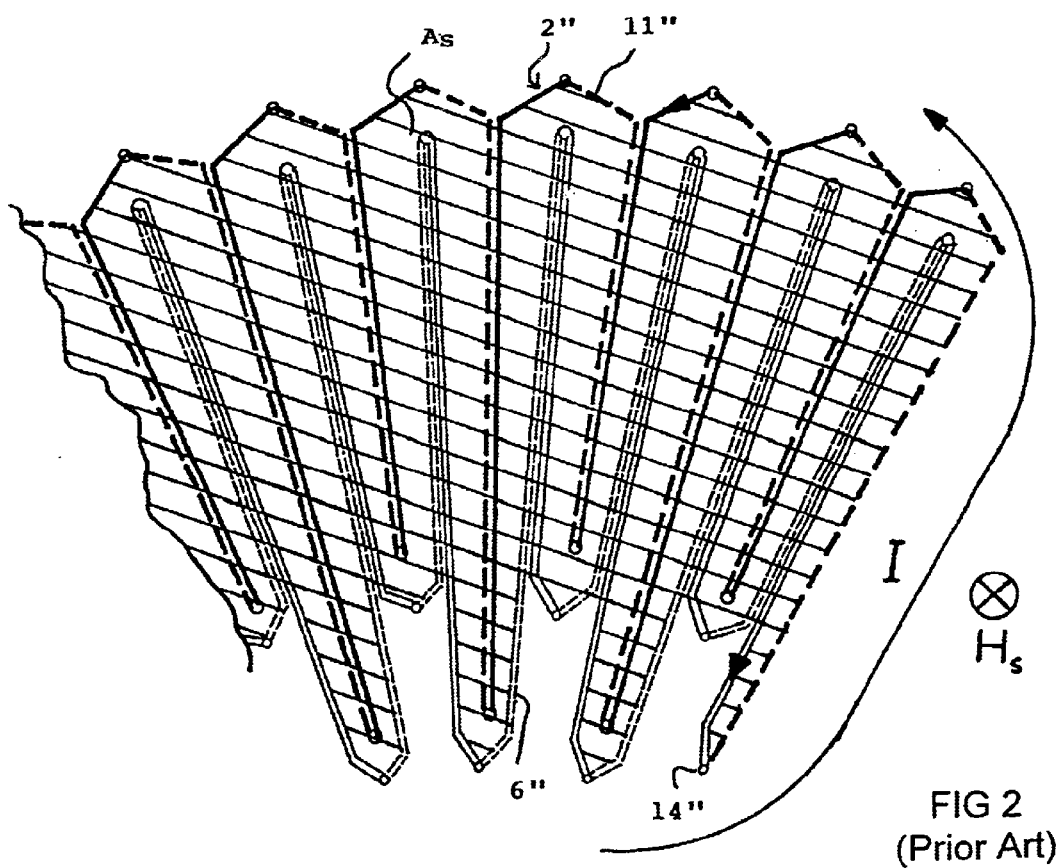
FIG. 2 is a plane view of a portion of a conventional Rogowski coil.

In a conventional Rogowski coil of the type shown in FIG. 2, the surface area $A_s$ subject to magnetic interference fields $H_s$ is between 100 and 200 times greater than the measurement surface area $A_m$ of a winding. Since there may be 200 or more windings however, the overall measurement surface area may be slightly larger than the surface area subject to interference fields, therefore having a low signal to noise ratio.

The aforementioned limitation of conventional sensors and the problems related thereto have, as far as is known, not been addressed. In sensors according to the present invention, the surface area $A_s$ subject to magnetic interference fields has been significantly reduced (FIG. 3) with respect to conventional devices, or, as in the embodiment of FIG. 4, the return conductor crosses over the first coil portion such that adjacent surface areas subject to interference fields have current circulation in opposing directions to cancel each other out. Preferably, both measures are introduced in the sensor according to this invention, such as in the embodiment of FIG. 4. The invention will now be described in more detail with reference to FIGS. 3–17.

Figure 3:
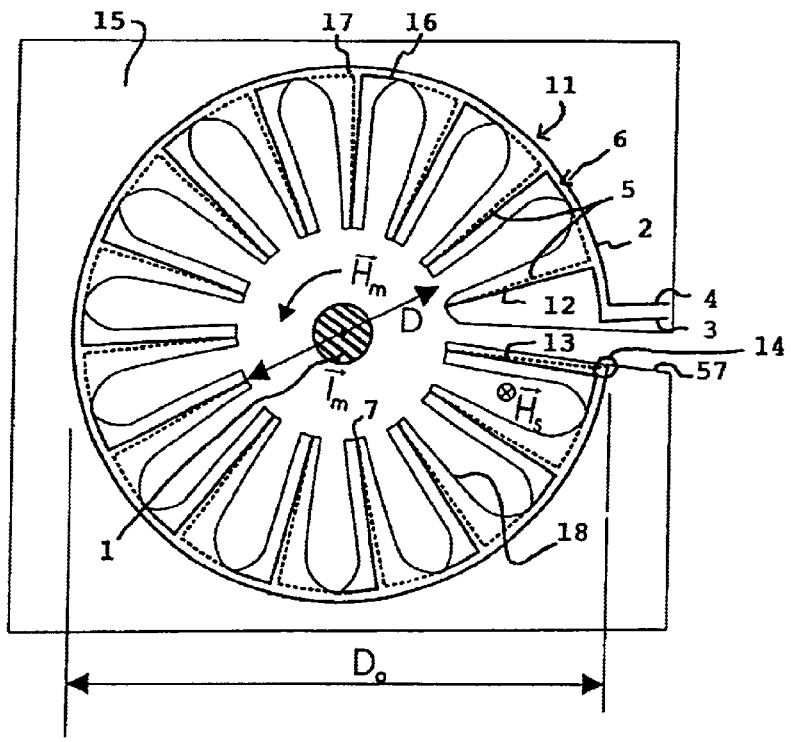
FIG. 3 is a view of a first embodiment of a sensor according to the invention.

Referring to FIG. 3, a current sensor comprises a sensor conductor 2 having ends 3, 4 for connection to a signal processing circuit, and a plurality of windings 5 forming a first coil portion 6 arranged around an opening 7 for receiving a portion 1 of a primary conductor in which a current $I_m$ flows inducing a magnetic field $H_m$ therearound. The first coil portion 6 is connected at a first extremity 12 thereof to the first sensor conductor end 3 and at the other extremity 13 to a second conductor portion 11 at connection point 14, the second conductor portion 11 connected at its other end to the sensor conductor end 4. In FIG. 3, the solid lines of the conductor represent conductor traces or wiring on an upper side of a circuit board 15 and the dotted lines represent circuit traces or wiring on an underside of the circuit board. The conductive tracks forming the windings 5 are arranged substantially in planes (radial planes) parallel to the primary conductor portion 1, such that the projected surface area of each winding on a plane orthogonal to the primary conductor portion is zero or close to zero. Furthermore, the second conductor portion 11, which returns from the second extremity of the first coil portion to the first extremity thereof, is positioned as close as practical to the outer periphery 16 of the first coil portion, such that the surface area 17 enclosed by the sensor conductor portions 11, 16, as projected on a plane orthogonal to the primary conductor portion, is as small as practically possible. The distance separating the second conductor portion 11 and the outer periphery 16 is determined by manufacturing tolerances and the need to maintain a certain insulating distance between the conductor portions to avoid short circuits or dielectric breakdown.

The influence of magnetic interference field components $H_s$ substantially parallel to the primary conductor portion 1 is thus significantly reduced in the present invention in comparison to conventional sensors. Since the relationship between the measurement surface area $A_m$ of a winding, i.e. the projected surface area of one winding in a plane orthogonal to the generated magnetic field $H_m$ to be measured, is substantially greater than the projected interference field surface area $A_s$ that may adversely influence the sensor in the presence of interference fields, the present sensor is greatly improved over conventional sensors and the number N of windings may be reduced, thus also improving the bandwidth of the sensor by increasing the resonance frequency. The resonance frequency is in particular increased due to the shorter length of the conductor, which reduces its self-inductance, and the greater spacing between windings which reduces the capacitive effects therebetween. It may be noted that if too few windings are provided, then the current measurement dependency on the positioning of the primary conductor at the center of the opening 7, or at any other position for which the sensor is calibrated, cannot be neglected and thus an optimal number of windings is needed to compromise between the positioning error of the sensor relative to a conductor carrying the current to be measured and the bandwidth, in particular the upper frequency limit.

In order to improve the resonance characteristics, the dielectric constant between turns of the winding may be adjusted by providing cut-outs 18 or material with a low dielectric constant between windings.

It has been found in embodiments of the invention that for a sensor having an outer diameter $D_o$ of 65 mm and an inner diameter $D_i$ of 23 mm, 40 windings are sufficient to achieve accurate measurement where the effects of positioning of the primary conductor within the central opening is negligible. It is to be noted that the optimal number of windings is dependent on the outer and inner diameters $D_o$, $D_i$ of the sensor.

The sensor conductor 2 may be in the form of conductive tracks in or on a circuit board, or in the form of a wire wound around a board or other support, or made in various other conventional ways of producing coils.

Figure 4:
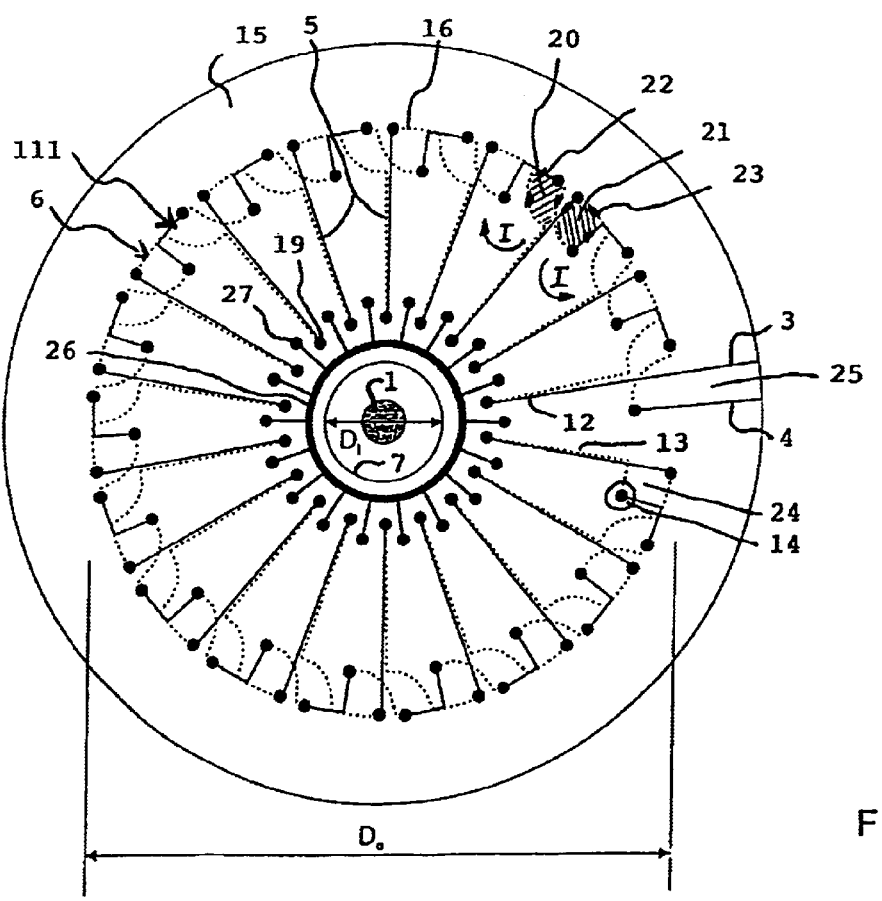
FIG. 4 is a view of a second embodiment of a sensor according to the invention.

Referring to FIG. 4, another embodiment of a sensor according to the invention is shown. In the following, very similar or identical features are indicated with the same reference numerals as in the previously described embodiments and are therefore not further described.

In the embodiment according to FIG. 4, the second conductor portion 111 which extends along the outer periphery 16 of the first conductor portion 6 crosses over the first conductor portion between adjacent windings 5, such that the second conductor portion and the outer periphery 16 of the first conductor portion are twisted around each other. The conductive tracks on the underside of the circuit board 15 may be interconnected to tracks on the upper side of the circuit board by, for example, means of vias or plated through-holes 19, as is known for example from conventional designs. The twisting of the peripheral portions of the first and second conductor portions produces first and second adjacent interference field surface areas 20, 21, as projected on a plane orthogonal to the primary conductor portion, enclosed by portions 22, 23 of the conductor 2 which define interference field current circulating portions. The conductors have a resulting twist with the effect that voltages, which are induced in a part, are exactly compensatable by voltages in the adjacent parts. In practice, this may be proven by looking at a fictive current and its direction of rotation around the compensating areas. An electrical current induced by a magnetic field $H_s$ orthogonal to the interference field surfaces 20, 21 circulates in opposite directions, for example, an induced current in the circulating portion 23 circulates in the anti-clockwise direction while the induced current in the circulating portion 22 circulates in the clockwise direction. If the surfaces 20, 21 are of substantially the same size, the magnetic interference field $H_s$ will induce voltages of equal magnitude but with opposite signs in the circulating portions, thus cancelling out the effect of the magnetic interference field. The surface area 17 of the embodiment of FIG. 3, which corresponds to a non-compensated interference field surface area formed between the first and second conductor portions, is thus substantially eliminated by compensation in the embodiment of FIG. 4, except for the corner surface areas 24, 25 at the extremities 12, 13 of the first coil portion 6 which are not compensated.

In sensors according to this invention, it is preferable to connect the conductor ends 3, 4 to a very high impedance in the range $10^3$ Ohms, so as to have a very small induced current, the signal measurement corresponding to the induced voltage between conductor ends 3, 4.

In order to reduce the capacitive effects between the plated-through holes 19 proximate the inner periphery, a conductive shielding ring 26 with radially extending shielding tracks 27 positioned intermediate adjacent windings 5 may be provided. The shielding ring may be electrically connected to the first or second conductor portion.

Figure 5:
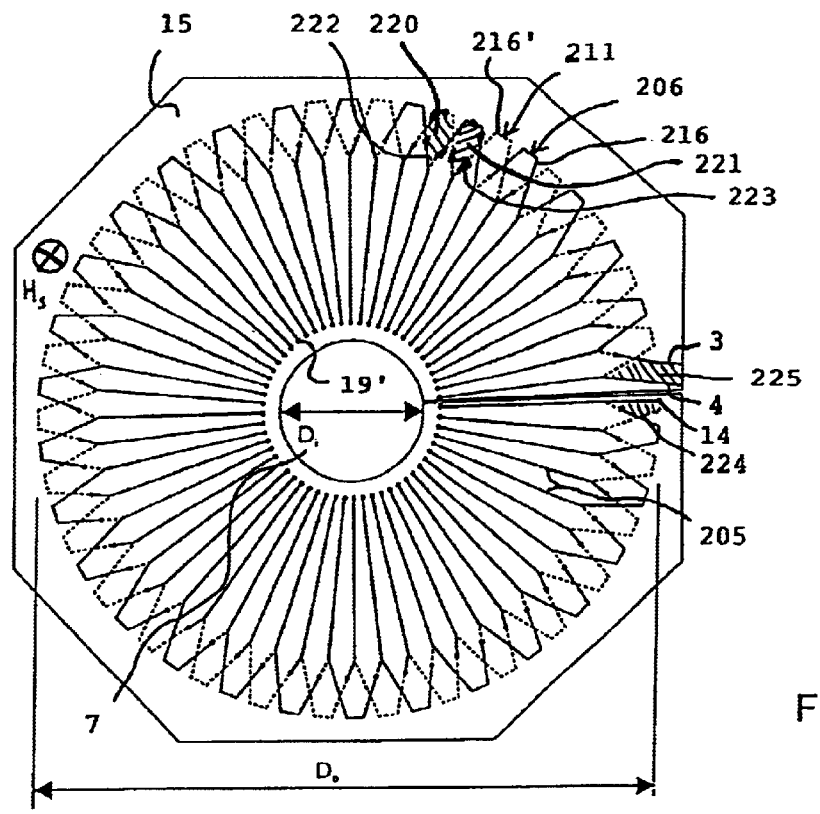
FIG. 5 is a view of a third embodiment of a sensor according to the invention.

Referring to FIG. 5, another embodiment is shown which differs from the embodiment of FIG. 4 substantially in that the second conductor portion 211 is in the form of a second coil portion that interleaves the first coil portion 206. As can be seen in FIG. 5, the outer peripheral portions 216 of the first coil portion 206 are provided on the upperside of the circuit board 15 and the outer peripheral portions 216' of the second coil portion 211 are on the upperside, and that they overlap each other so as to produce, as projected in a plane orthogonal to the primary conductor portion, a plurality of anti-clockwise interference field circulating portions 222 and clockwise interference field circulating portions 223 that cancel the induced voltage of a magnetic interference field $H_s$. Further to the cancelling effect, the interference field surface areas 220, 221 enclosed in the circulating portions 222, 223 are made as small as practically possible, without introducing capacitive coupling, for example between plated-through holes and adjacent conductors, which may reduce the resonance frequency of the sensor.

Figure 6:
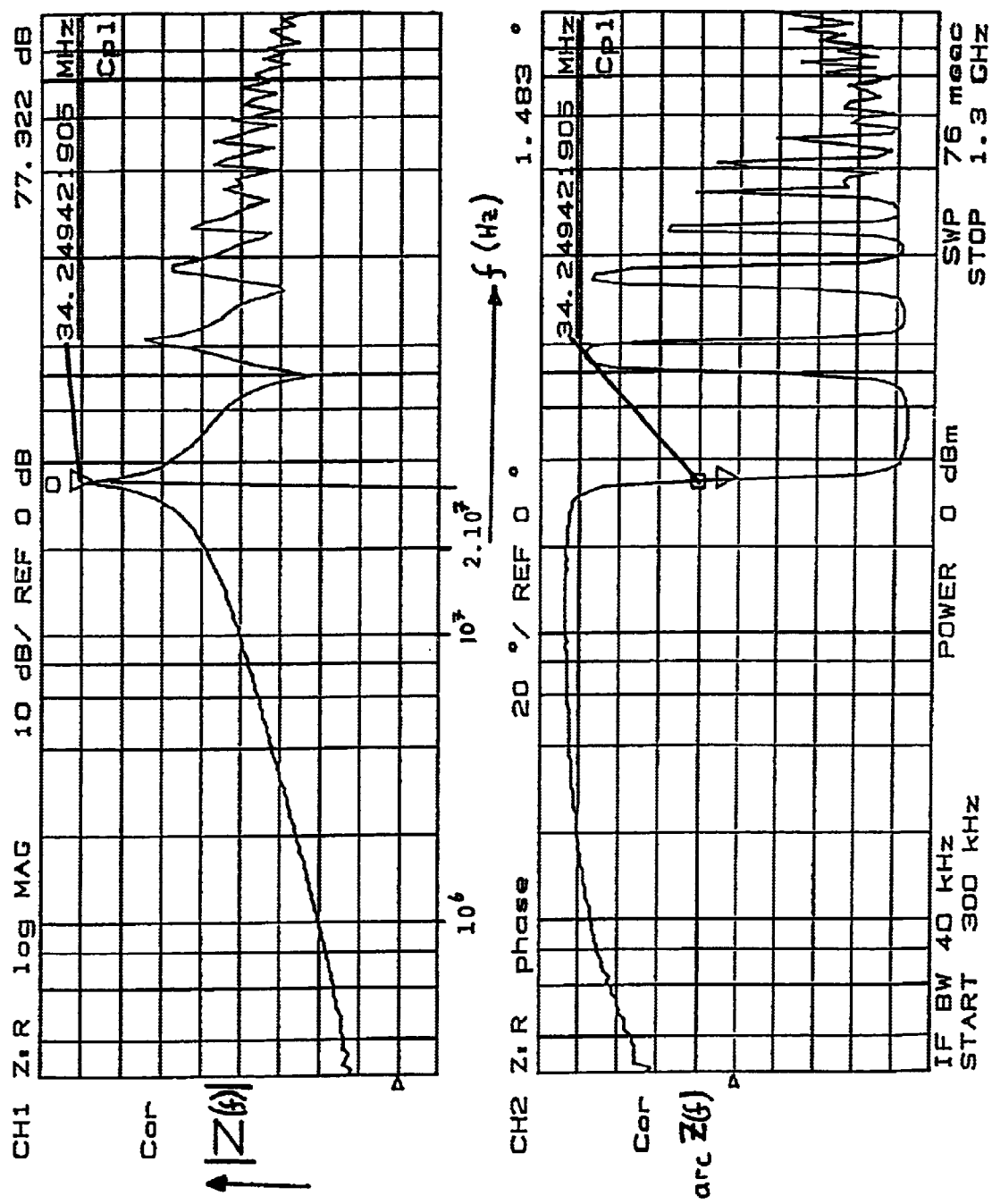
FIG. 6 shows Bode diagrams (absolute value and phase of the impedance) versus the frequency of a sensor having a construction similar to the embodiment of FIG. 5.

Referring to FIG. 6 which shows Bode plots of the impedance as a function of frequency of a sensor with a similar design to the embodiment of FIG. 5, where the inner diameter $D_i$ is 23 mm, the outer diameter $D_o$ is 65 mm, and the total number of turns N of the first and second coil portions equals 45. The Bode plots of FIG. 6 show that the first resonance frequency of the sensor is at just over 34 megahertz, which is significantly higher than the resonance frequency of conventional sensors which, as far as is known, do not exceed a few megahertz. Furthermore, the non-compensated interference measurement area of the sensor embodiment according to FIG. 5 corresponds to the projected surface areas 224, 225, which are comparable in size (i.e. less than 10 times the size) or smaller than the measurement surface area $A_m$ of a winding, whereas in a conventional design, as already mentioned, the interference field surface area may be in the order of a 100 to 200 times greater than the measurement surface area of one winding.

Figure 7:
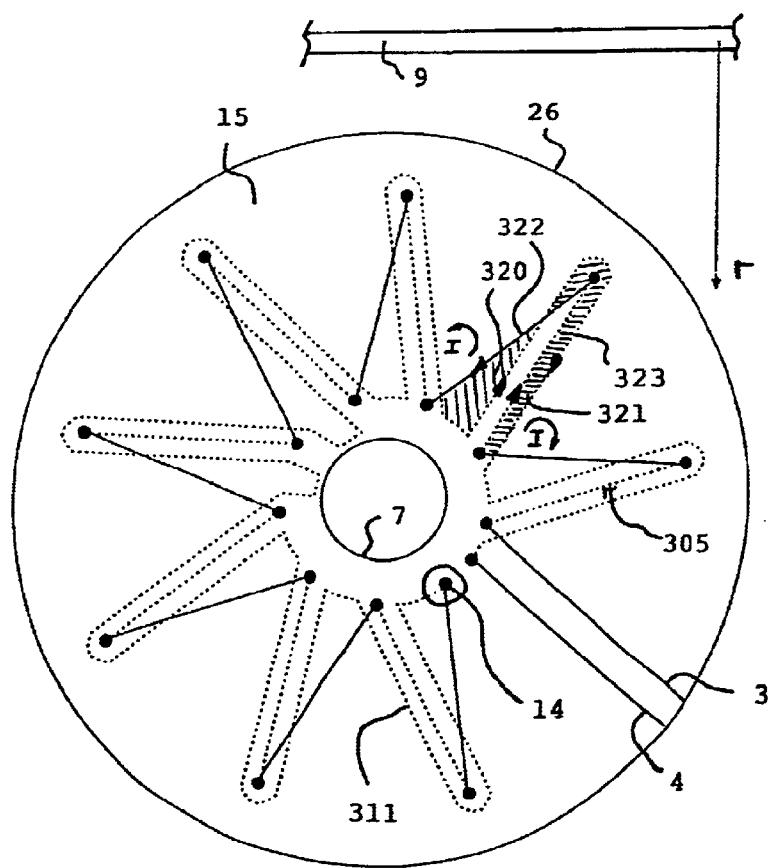
FIG. 7 is a view of a fourth embodiment of a sensor according to the invention.

In the sensor according to FIG. 7, the first conductor portion has windings 305 connected at return connection point 14 to the second conductor portion 311 which extends only on the underside of the board 15. The overlapping first and second conductor portions form anti-clockwise interference field circulating portions 322 and clockwise interference field circulating portions 323 enclosing similar sized interference field surface areas 320, 321 respectively, such that the voltage induced by a magnetic interference field $H_s$ is substantially cancelled. It is to be noted that the surface areas 320, 321 are not identical in this embodiment, since they are at different mean distances from the border 26 of the board 15, whereby the effect of a magnetic interference field $H_s$ produced by a interference current $I_s$ in a conductor 9 reduces magnitude as a function of 1/r where r is the radial distance from the centre of the conductor 9.

Figure 8:
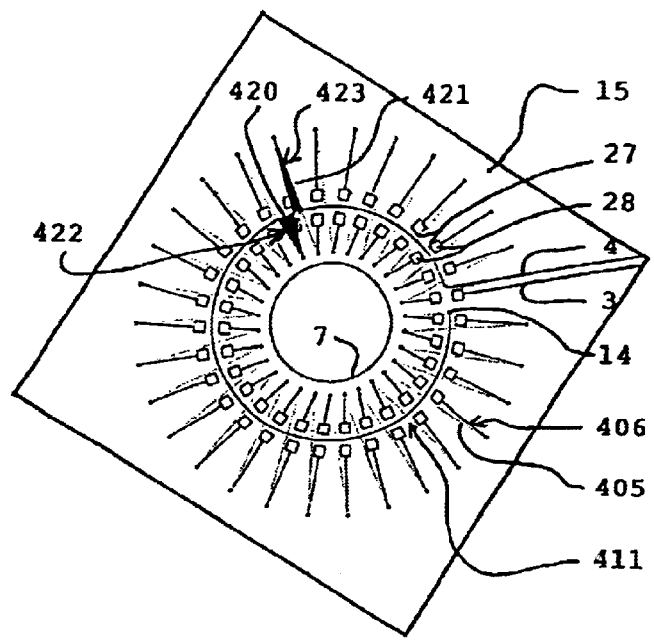
FIG. 8 is a view of a fifth embodiment of a sensor according to the invention.

In a sensor according to FIG. 8, which is provided with a first conductor portion 406 with windings 405 interconnected at return connection point 14 to a second conductor portion 411 which returns to the conductor end 4 concentrically around the inner periphery near a median position between the inner and outer peripheries of the first coil portion on an upper side of the board 15. The conductor portions of the windings 405 on the upper side are interrupted with a gap 27 flanked by surface pads 28 for the connection of impedances, and for example surface mount resistances thereacross. The impedances may be selected to improve the performance of the sensor, for example by damping the first resonance frequency. As in the previously described embodiments of FIGS. 4 to 7, clockwise and anti-clockwise interference field circulating portions 422, 423 have a cancelling effect. The circulating portions 422 on the radially inner side of the second conductor portion 411 have a greater projected surface area 420 than the surface area 421 of the interference field circulating portion 423 on the radially outer side of the second conductor portion 411 for reasons already mentioned, i.e. to take into account the different distances from a conductor producing a magnetic interference field.

Figure 9:
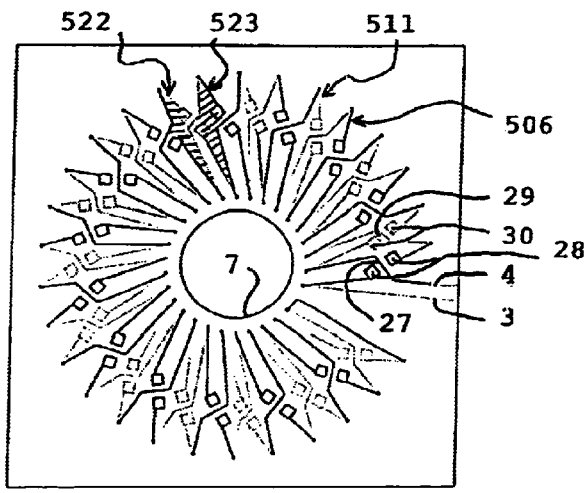
FIG. 9 is a view of sixth embodiment of a sensor according to the invention.

In the sensor according to FIG. 9, the first conductor portion 506 and second conductor portion 511 both have windings interrupted by gaps 27, 29 flanked by surface pads 28, 30 where the windings cross over each other through the gaps 27, 29. As in the previous embodiment, impedances bridge the contact pads 28, 30. Adjacent interference field circulating portions 522, 523 have opposed circulating directions, thus cancelling the effect of magnetic interference fields $H_s$.

Figure 10:
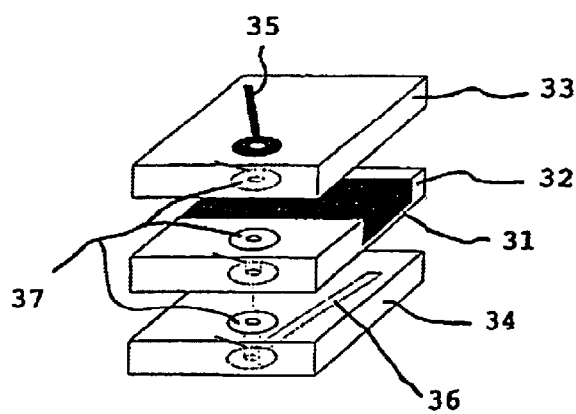
FIG. 10 is an exploded detail view of part of a sensor according to the invention.

Referring to FIG. 10, while the aforementioned embodiments comprise coil portions in the form of air coils, the coil portions may also be provided with a core 31 having a magnetic permeability greater than 1 to increase the magnetic field in the coil portions and thus increase the magnitude of the output signal, although the non linearity introduced by hysteresis of the core needs to be accounted for. The core 31 may for example be made of ferrite and inlaid in a layer 32 of a multi-layer board or stacked boards where the upper and lower layers 33, 34 are provided with the conductive traces 35, 36 of the windings, which are for example interconnected by means of plated through-holes 37.

The stacking of layers or boards can also be provided to increase the measurement surface area $A_m$ of the windings, thereby increasing the magnitude of the output signal.

In a sensor according to FIGS. 11a and 11b which comprises a multi-layer board or stacked boards 615 with at least three layers 633, 632, 634, the windings 605 of the first conductor portion 606 are provided on the upper and lower faces of the upper and lower layers 633, 634, respectively, whereas the winding 605' of the second conductor portion 611 is provided on the upper and lower faces of the inner layer 632, sandwiched between the upper and lower, layer 633, 634. The overlapping first and second coil portions 606, 611 define, respectively, adjacent clockwise and anti-clockwise interference field circulating portions 622, 623, of substantially equal surface areas 620, 621 respectively, thereby cancelling the voltage induced by a magnetic interference field $H_s$.

Referring to the embodiment of FIGS. 12a to 12d, which shows a two-layer board or stacked boards with layers 733, 734 and an insulative layer 732 positioned therebetween. The windings 705 of the first conductor portion 706 are provided on the upper layer 733 and the windings 705' of the second conductor portion 711 provided on the lower layer 734. The windings are arranged such that the conductive tracks of respective portions of the windings are positioned directly above or below and in alignment with each other, as can be best seen in the schemas of FIGS. 12b and 12c. Thus, the upper branch 38 and lower branch 39 and orthogonal end branches 41, 42, 43, 44 define together a measurement winding with a measurement surface area $A_m$, and the lower branch of the upper winding and upper branch of the lower winding 45, 46, respectively, in which current flows in opposite directions, cancel each other out. This construction eliminates surface areas orthogonal to the direction of the primary current to be measured and which are subject to the effect of magnetic interference fields, other than the surface 724 at the connection of the conductor ends 3, 4 to the respective first and second conductor portions 706, 711.

In FIG. 12c, the first and second conductor portions are interconnected at return connection point 714 at the plated through-hole interfaces 714', 714" of the upper and lower layers 733, 734, respectively.

In the embodiment of FIG. 13a, the sensor is provided with two separate sensor conductors 802, 802' having conductor ends 804, 803, 804', 803' respectively, for connection to a signal processing circuit. The two separate conductors 802, 802' provided on separable board halves 815, 815' respectively enable positioning around the primary conductor 1. The windings of first and second conductor portions may be substantially the same as those of other embodiments, for example like the embodiment of FIG. 5, except that the return connection point 814, 814' is situated approximately halfway around, i.e. 180° from the conductor ends 803, 804, 804', 803', respectively.

As shown in FIG. 13b, the boards 815, 815' may be in an overlapping relationship, the relative displacement in the current flow direction of one board with respect to the other having a negligible effect.

Substantially the same principle is reproduced in the embodiment according to FIG. 16 where the two halves 915, 915' can be pivoted open about a hinge 47 by pressing together finger grips 48 biased apart with a spring 49.

As in the previously described embodiment, the first and second conductor portions 906, 911, 906', 911' are connected at the return connection point 914, 914', respectively. As may be noted with the embodiment of FIG. 16, the sensor may have different shape openings, such as the oblong opening 907, to accommodate rectangular primary conductors 1' typically used in high amperage power conductors.

The first coil portions 906, 906' of the two halves 915, 915' are interconnected at hinge point 47, such that the two ends 903, 904 of the second conductor portions 911', 911, respectively, form the conductor ends for connection to the signal processing circuit.

In the embodiment of FIG. 16, the second conductor portions 911, 911' are criss-crossed by the peripheral portions 916 of the respective first coil portions, such that adjacent clockwise and anti-clockwise interference field circulating portions 922, 923, are formed which, as in previously described embodiments, cancel the effects of magnetic interference fields $H_s$.

FIG. 15 shows an embodiment which is very similar in construction to the embodiment of FIG. 16, except that the sensor is provided with an open end 50, and therefore does not completely surround the primary conductor 1', whereby this embodiment does not need to be hinged or otherwise separated. The mutual inductance between the primary conductor and sensor coil portions however has to be determined, since the coil does not completely surround the primary conductor. It may be noted that in other embodiments described herein, the support or board 15 may be flexible such that it can be bent out of its plane to open a slit 57 (see FIG. 3) between extremities 12, 13 of the coil portions for positioning of the sensor around the primary conductor.

Referring to FIGS. 17a and 17b, a sensor according to another embodiment of the invention for a measurement of time-varying currents between a corresponding pair of flat power conductors or sheet bus bars 1', 1" is shown. The sensor comprises a conductor 1002 in the form of, for example, circuit traces on a circuit board 1015, the conductor comprising a first conductor portion 1006 with a plurality of windings 1005 connected at a second extremity 1013 thereof, at connection point 1014, to a second conductor portion 1011 that returns the conductor to the first extremity 1012 of the first coil portion and the connection end 4 for connection to a signal processing circuit. An insulating layer 51 is provided on either side of the board 1015 to insulate the sensor with respect to the primary conductors 1', 1". The magnetic field to be measured $H_m$, generated by the primary currents $I_m$ and $-I_m$ and circulating between the conductors, is well defined and substantially constant along the length and height of the sensor, such that the current to be measured can be precisely determined. A significant advantage of this embodiment is its compacity and the ability to easily position it between power conductor pairs 1', 1" at many different positions therealong, in crowded environments or where conductors are difficult to access.

The sensor of FIGS. 17a and 17b may however also be one element of a chain of sensor elements, for example in the form of a belt, that can be clipped around one of the power conductors 1' or 1", thereby using the measuring principle of a Rogowski coil sensor. The first and second conductor portions 1006, 1011, respectively, have a design similar to corresponding portions of the embodiment of FIGS. 15 or 16, whereby conductor circulating portions subject to magnetic interference fields are reduced to a practical minimum (taking into account the necessary dielectric separation and manufacturing tolerances) and provided with circulating portions 1022, 1023 that compensate each other.

Referring to FIG. 14, a sensor embodiment similar to that of FIG. 5 is shown, except that the windings 205 of the first and second coil portions are provided in packets 52 separated by spaces 53, in order to increase the resonance frequency for reasons similar to the provision of packets of windings in transformers.

What is claimed is:

1. A current sensor for measuring a time-varying electrical current ($I_m$) in a portion of primary conductor (1, 1', 1"), the sensor including a support or board and a sensor conductor in the form of conductive traces thereon or therein comprising first and second ends (3, 4, 803, 804, 803', 804', 903, 904) for connection to a signal processing circuit, a first conductor portion extending from the first end and having a plurality of windings (5, 205, 305, 405, 605, 705, 705', 1005) to form a first coil portion extending from a first coil portion extremity to a second coil portion extremity, and a second conductor portion returning from the second coil portion extremity to a position proximate the first coil portion extremity and to the second end, centres of the windings defining a median coil plane substantially parallel to the magnetic field ($H_m$) generated by the time-varying current ($I_m$) to be measured, the second conductor portion being arranged such that the surface area of the one or more projected interference field surfaces ($A_s$) is less than ten times the measurement surface area ($A_m$) of a winding times the number of windings, wherein the first and second conductor portions cross over each other to define a plurality of interference field surfaces, as seen projected on the median plane, enclosed by a plurality of clockwise and anti-clockwise interference field current circulating portions (17, 22, 23, 222, 223, 322, 323, 422, 423, 522, 523, 622, 623, 922, 923, 1022, 1023) having surface areas and arranged such that the voltage induced by a magnetic interference field component ($H_s$) perpendicular to the median plane in the clockwise interference field circulating portions is substantially cancelled by the voltage induced in the anti-clockwise interference field circulating portions.

2. A sensor according to claim 1, wherein the second conductor portion (11, 111, 911, 911', 1011) extends along an outer periphery (16, 916, 1016) of the first coil portion (6, 906, 906', 1006).

3. A sensor according to claim 2, wherein the outer periphery (16, 916, 1016) and second conductor portion (111, 911, 911', 1011) cross over each other at regular spacing so as to form successive clockwise and anti-clockwise interference field circulating portions.

4. A sensor according to claim 3, wherein the second conductor portion crosses over the outer periphery of the first conductor portion at an intermediate position between adjacent windings.

5. A sensor according to claim 1, wherein the second conductor portion comprises a plurality of windings to form a second coil portion.

6. A sensor according to claim 5, wherein the first and second coil portions (606, 611; 706, 711) are provided on different layers or boards (633, 632, 634; 733, 732).

7. A sensor according to claim 6, wherein the windings (705, 705') of the first and second coil portions are substantially aligned one above the other, as seen in the direction of the primary conductor portion (1).

8. A sensor according to claim 1, wherein the windings of the second coil portion (211, 511, 611) are positioned intermediate the windings (205, 605) of the first conductor portion (206, 506, 606).

9. A sensor according to claim 8, wherein the windings (205) of the first and second conductor portions (206, 211) cross over each other at outer peripheral portions (216, 216'), such that successive adjacent clockwise and anti-clockwise interference field circulating portions (222, 223) are formed at the outer periphery of the coil portions.

10. A sensor according to claim 8, wherein the windings of the first and second conductor portions (506, 511; 606, 611) cross over each other at a position intermediate the outer periphery and inner periphery of the coil portions, such that successive adjacent clockwise and anti-clockwise interference field circulating portions (522, 523; 622, 623) extending from the inner to the outer periphery are formed.

11. A sensor according to claim 1, wherein the sensor comprises separable parts for assembly around the primary conductor, each part having said first and said second conductor portions interconnected at respective return connection points (814, 814'; 914, 914').

12. A sensor according to claim 11, wherein the return connections points are positioned at about 180° opposite the conductor ends (803, 804; 803', 804'; 903, 904).

13. A sensor according to claim 1, wherein conductor portions of at least some of said windings are interrupted with gaps (27, 29) bridged with impedances.

14. A sensor according to claim 1, wherein the sensor comprises a substantially flat element having a linear said first coil portion (1006) insertable between a corresponding pair of flat conductors (1', 1).

15. A sensor according to claim 14, wherein the sensor comprises a plurality of said flat elements arranged in the form of a belt for positioning around a primary conductor (1).

16. A sensor according to claim 1, wherein a core (31) of magnetic permeability greater than 1 is inserted between upper and lower conductive portions (35, 36) of the windings.

* * * * *